United States Patent [19]
Avra

[11] Patent Number: 4,974,184
[45] Date of Patent: Nov. 27, 1990

[54] MAXIMUM LENGTH PSEUDO-RANDOM TEST PATTERN GENERATOR VIA FEEDBACK NETWORK MODIFICATION

[75] Inventor: Lanae Avra, Plymouth, Minn.

[73] Assignee: Honeywell Inc., Minneapolis, Minn.

[21] Appl. No.: 512,048

[22] Filed: Apr. 19, 1990

Related U.S. Application Data

[63] Continuation of Ser. No. 190,611, May 5, 1988, abandoned.

[51] Int. Cl.$^5$ .............................................. G06F 1/02
[52] U.S. Cl. .................................................... 364/717
[58] Field of Search ......................... 364/717; 331/78; 380/46; 371/25, 27

[56] References Cited

U.S. PATENT DOCUMENTS

| | | | |
|---|---|---|---|
| 3,881,099 | 4/1975 | Ailett et al. | 364/717 |
| 4,023,026 | 5/1977 | O'Farrell | 364/717 |
| 4,503,537 | 3/1985 | McAnney | 371/25 |
| 4,513,418 | 4/1985 | Bardell, Jr. et al. | 371/25 |
| 4,519,078 | 5/1985 | Komonytsky | 371/25 |
| 4,594,711 | 6/1986 | Thatte | 371/25 |
| 4,597,080 | 6/1986 | Thatte et al. | 371/25 |
| 4,672,610 | 6/1987 | Salick | 371/27 |
| 4,680,761 | 7/1987 | Burkness | 371/25 |
| 4,785,410 | 11/1988 | Hamatsu et al. | 364/717 |
| 4,845,654 | 7/1989 | Harada et al. | 354/717 |

OTHER PUBLICATIONS

"LOCST: A Built-In Self-Test Technique", by J. J. LeBlanc, published 11/84, IEEE Design & Test of Computers, vol. 1, No. 4, pp. 45-52.
Built-In Self-Test Techniques, by E. J. McCluskey, published 4/85, IEEE Design & Test of Computers, vol. 2, No. 2, pp. 21-28.
Circuits for Pseudo-Exhaustive Test Pattern Generator, by Luang-Terng Wang & E. J. McCluskey, published 1986; IEEE 1986 Internat'l Test Conf., pp. 25-37.
A Hybrid Design of Maximum-Length Sequence Generators, by Laung-Terng Wang & E. J. McCluskey, published 1986, IEEE 1986 Internat'l Test Conf., pp. 38-46.
Project Status Report VHSIC Phase 2, Contract No. F33615-84-C-1500, Oct. 1986, Honeywell—Solid State Electronics Division.
Interim Technical Report (Draft) VHSIC Phase 2, Contract No. F33615-84-C-1500, Oct. 1986-Mar. 1987, Honeywell—Solid State Electronics Division.

Primary Examiner—Dale M. Shaw
Assistant Examiner—Tan V. Mai
Attorney, Agent, or Firm—Gregory A. Bruns

[57] ABSTRACT

A system and method for generating $2^n$ test patterns is disclosed. The system utilizes a linear feedback shift register (LFSR) to generate a sequence of $2^n-1$ test patterns. In addition, the system includes apparatus external to the shift register which generates a $2^n$th test pattern. A switching circuit is employed to insert the $2^n$th test pattern into the sequence of test patterns. Therefore, a $2^n$ test pattern sequence is generated. The test pattern sequence produced is pseudo-random in nature. The system further includes an output for providing a test pattern; such output could be used for the testing of a very large scale integration (VSLI) sub-system such as read only memory (ROM). A method utilizing the techniques embodied in the system is also disclosed.

27 Claims, 9 Drawing Sheets

MAXIMUM LENGTH PSEUDO-RANDOM TEST PATTERN GENERATOR VIA FEEDBACK NETWORK MODIFICATION

The Government has rights in this invention pursuant to Contract No. F33615-84-C-1500 awarded by the Department of the Air Force.

This is a continuation of application Ser. No. 07/190,611, filed May 5, 1988, now abandoned.

BACKGROUND OF THE INVENTION

The present invention relates to test pattern generators used in circuit testing and, more particularly, to modified n-bit linear feedback shift register (LFSR) circuit designs.

Traditionally, large scale integrated circuits have needed to be tested for defects or flaws. When only a fraction of the total components produced by a manufacturing process are "good" (i.e., meet the requirements of specifications), something must separate the "good" components from components which contain defects or flaws. Testing does this by applying input stimulus (input test patterns) to the device-under-test and comparing the outputs of the device-under-test with the expected "good" results.

In the past, test pattern generation has been done by hand or with a limited amount of aid from a computer. As the designs of the circuits being tested become increasingly complex, the test time required to generate test patterns by hand increases significantly. For sequential circuitry, the time required has grown at a rate proportional to the number of gates cubed. In reality, costs of manual test pattern generation have not increased at this rate. Rather than invest the time and money required to obtain test results with complete fault coverage, designers often take short cuts which result in inadequate and low-quality test sets.

At the present time the cost of testing depends a great deal on the capital expenditures required for automatic test equipment (ATE). Further, as the number of component input and output pins in the tested circuits increases, and as the components operate at higher frequencies, the complexity and cost of ATE increases. Furthermore, as the complexity of the components increase, so does the number of test patterns. This increase in the number of test patterns results in an increase in test time which then relates to a requirement for additional ATE capacity. Today, a single integrated circuit tester can cost in excess of two million dollars. The price of an hour of testing time can be considerable given the depreciation costs of a circuit tester, tester maintenance costs, and the cost of test engineering support.

An alternative to multi-million-dollar chip testing exists. Designers can incorporate a number of simple design techniques into their circuit design which will reduce the cost of test pattern generation and application while actually allowing better test quality. In addition, it is possible to build into the circuit to be tested a number of capabilities typically required of external test equipment. These built-in self-test (BIST) techniques can greatly simplify automatic test equipment requirements and can result in significant costs savings.

Although testability-improvement techniques and built-in self-test techniques are attractive from the perspective of test cost reduction, they carry with them some significant costs which must be evaluated. Most design-for-test techniques consume chip real estate, power, I/O pins and may impact the speed performance of the circuit during normal operation.

Designs which use built-in self-test provide for generation of input stimulus and evaluation of the circuit response within the actual circuit design. To minimize the on-chip circuitry, external sequencing of the self-test operation is often used. A variety of methods exist for both providing the input stimulus and evaluating the circuit response. Among the most widely used self-test techniques are parallel built-in self-tests of ROMs/RAMs and pseudo-random self-tests.

The addition of a counter to an existing circuit design would enable most built-in self-test techniques to generate test patterns. However, a relatively high number of gates are required to form a counter and a counter does not generate patterns in a pseudo-random fashion. Consequently, many built-in self-test techniques use linear feedback shift registers (LFSR). A LFSR can provide the same test patterns as a counter but can be implemented with a smaller number of gates than a counter of the same number of bits. As a result, the impact on the chip is minimized. In addition, modified versions of the LFSR can be used for both test pattern generation and for compaction of the test results.

The output of an n-bit linear feedback shift register is a pattern of 0's and 1's which is n-bits long. In this case, a bit is an abbreviation for an element of memory which can represent a single binary digit such as a "1" or a "0", and n is in reference to the variability of the length of the register (i.e. number of bits). Thus, the number of possible patterns or states for an n-bit linear feedback shift register is $2^n$. If we start the linear feedback shift register in one of these states, it then progresses through some sequence of these states. It can be shown that a periodic succession of states will ultimately result. The feedback function $F(X_1, X_2, \ldots X_n)$ can be expressed in the form:

$$F(X_1, X_2, \ldots, X_n) = C_1 X_1 \oplus C_2 X_2 \oplus \ldots \oplus C_n X_n$$

If for each of the constants C, C is either a "0" or a "1", and if the symbol $\oplus$ denotes the exclusive-or (XOR) or the addition module 2 function (wherein the result is "1" for the odd sums and "0" for even sums), then the shift register is called linear. A characteristic of linear feedback is that the value of any of the signals used in the feedback network will have an equal weight in determining the feedback value. Therefore, the resulting test sequence will be psuedo-random in nature. By properly choosing the linear feedback network, the state sequence of an n-bit LFSR can be maximized to a length of $2^n - 1$ different states. Even with a maximum-length LFSR one state of the LFSR is not included in the sequence. This missing state is often called the "stuck-state" because if the LFSR is initialized to this state, it remains stuck and does not transition to any other state. The inability of an LFSR to generate the entire sequence of $2^n$ different states (input test patterns) can be an undesirable feature in some testing situations.

Current designs which solve the problem of generating the entire set of input test patterns exist. However, they require the modification of the registers by adding XOR gates between bit-slices. This solution entails building complex, non-standard and expensive registers, which are undesirable if a standard register design exists in a cell library.

The present invention overcomes the problem of generating an incomplete set of input test patterns (e.g., $2^n-1$ test patterns) for testing a chip or circuit. Through the present invention, a complete set of input test patterns (i.e., $2^n$ test patterns) is generated, and this is accomplished in a manner which minimizes the necessary modifications to the integrated circuit design and in a manner which minimizes the number of gates that must be added to the integrated circuit design.

In the present invention, modifying circuitry is added to the feedback network connected to a standard register rather than modifying the standard register itself. Therefore, the modifications made to the test pattern generator do not impact the basic register design. A maximum-length test pattern generator using the present invention includes n memory devices such as an n-bit register, a feedback network and modifying circuitry to allow for $2^n$ test patterns to be generated.

SUMMARY OF THE INVENTION

An exhaustive test pattern generator is provided for generating $2^n$ test patterns. More particularly, a shift register means is used to generate a sequence of $2^n-1$ test patterns. The test pattern generator also comprises means external to the shift register means for generating a $2^n$th test pattern and for inserting the $2^n$th test pattern into the sequence. The test pattern generator further includes output means for providing at least one of the $2^n$ test patterns.

DETAILED DESCRIPTION OF PREFERRED EMBODIMENTS

Figure 1:
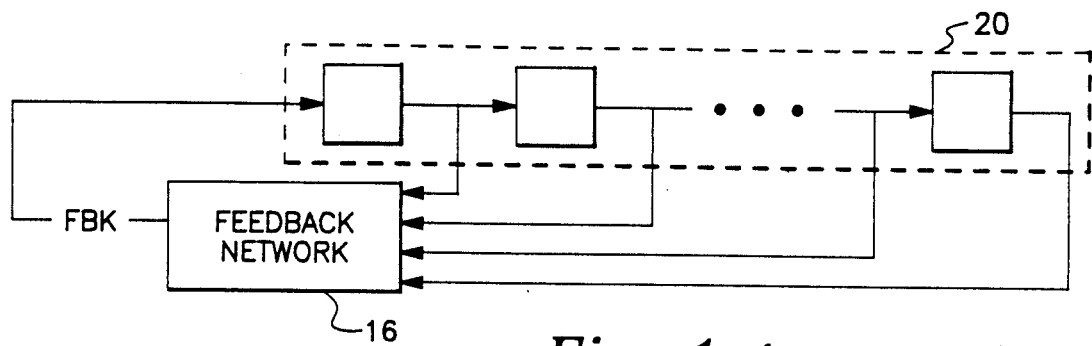
FIG. 1 is a prior art linear feedback shift register (LFSR).

Shown in FIG. 1 is a prior art linear feedback shift register (LFSR) comprising a logically serial coupled register 20 and feedback network 16. The maximum number of unique test patterns that can be generated by the circuit is $2^n-1$ where n is the number of one-bit memory devices (i.e. bi-stable multi-vibrators such as flip-flops or latches) logically serial coupled to one another to form register 20.

Figure 2:
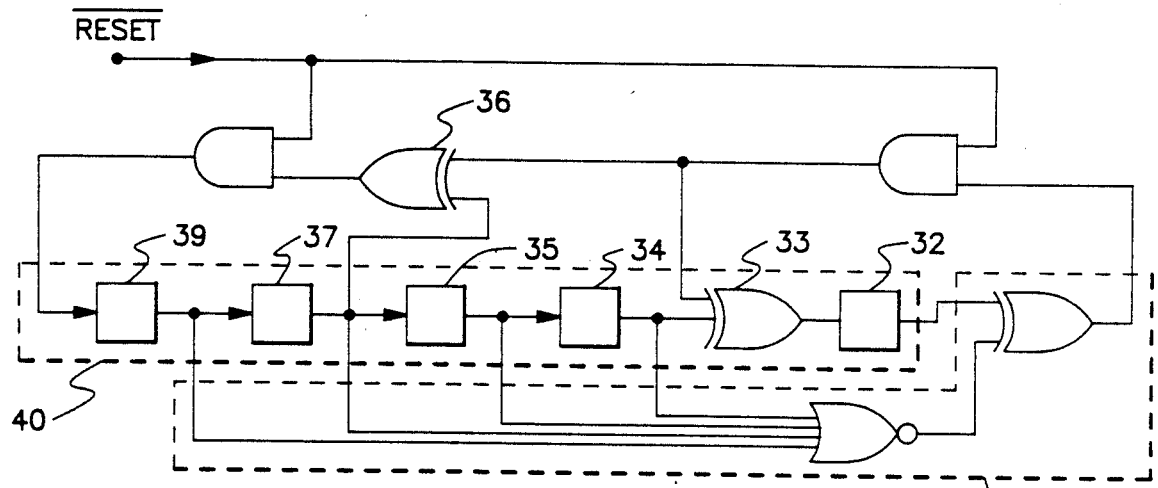
FIG. 2 is a prior art apparatus which can generate $2^n$ unique test patterns. The circuit is known as a modified maximum length sequence generator (MLSG).

Shown in FIG. 2 is a prior art apparatus which can generate $2^n$ unique test patterns. The circuit, known as a modified maximum length sequence generator (modified MLSG), was suggested by L. T. Wang, et.al. in "A Hybrid Design Of Maximum-Length Sequence Generators," Proceedings-1986 International Test Conference, Paper 1.3. Logically serial coupled register 40 is a modified register wherein an exclusive-or (XOR) gate 33 is inserted into the register to provide a feedback signal. The XOR gate 33, in conjunction with XOR gate 36, comprise a feedback network which when logically coupled with register 40 provides a test pattern sequence of $2^n-1$ unique test patterns. Modifying circuit 30 is logically coupled to register 40 and the feedback network to insert the $2^n$th test pattern into the test pattern sequence. The result is a test pattern sequence of $2^n$ unique patterns. However, this circuit design has the disadvantage of using a highly specialized register 40 with an XOR gate 33 inserted in the sequence of memory devices 32, 34, 35, 37, and 39. Use of specialized circuit designs can increase costs and design time of a circuit as well as decrease the flexibility of the surrounding circuit design.

The present invention overcomes these disadvantages by placing all modifying circuitry outside of the memory device (e.g., a register). This will allow the memory device design to be independent of the feedback network and modifying circuit design. Therefore, standard memory devices may be employed and, as better memory devices are developed, they may be inserted into an overall circuit design utilizing the concepts of the present invention without major design changes. Furthermore, the present invention requires fewer gates for implementation which in turn reduces chip real estate and power consumption.

It should be noted that the specific embodiments described below are described using commonly used positive logic descriptions. However, the scope of the present invention is not limited to procedures and apparatus which use positive as opposed to negative logic. Also, it should be noted that the specific embodiments described below are described using flip-flops. However, any bi-stable multi-vibrator device could be used to implement a procedure or an apparatus which utilizes the concepts of the present invention. Therefore, the scope of the present invention is not limited to the use of flip-flops.

Figure 3:
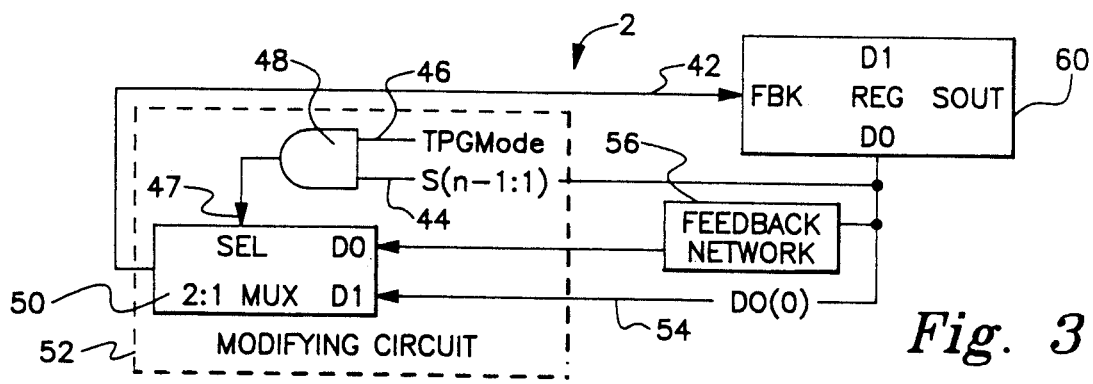
FIG. 3 is a drawing showing a general schematic diagram of an embodiment of an exhaustive TPG generator (exhaustive TPG) which follows the concepts of the present invention.

FIG. 3 shows a general schematic diagram of an embodiment of an exhaustive test pattern generator (exhaustive TPG) which follows the concepts of the present invention. Exhaustive TPG 2 comprises three elements including shift registers 60, feedback network 56, and modifying circuit 52. Shift register 60 can be any memory device which can react to a serially-loaded input signal and can provide parallel output signals indicative of the states of each bit of the stored "true"/"false" pattern. Feedback network 56 is a circuit which when logically coupled to the serial input and parallel outputs of shift register 60 causes the stored "true"/"false" pattern to sequence through $2^n-1$ unique test patterns, where n is the number of individual "true"/"false" states in shift register 60.

Modifying circuit 52 is external to register 60 and is inserted between shift register 60 and feedback network 56. Modifying circuit 52 is logically coupled to the output of feedback network 56, the plurality of parallel outputs of shift registers 60 and the serial input of shift register 60. Modifying circuit 52 inserts the missing $2^n$th state into the test pattern signal sequence so that $2^n$ unique test patterns are generated by shift register 60.

In the embodiment shown, a 2:1 multiplexer 50 and an AND gate 48 are used to switch between the two input signals provided to a modifying circuit 52. AND gate 48 generates a selecting signal which enables multiplexer 50 to apply a one-bit signal from circuit means 54 into serial input 42 of shift register 60. AND gate 48 has a plurality of inputs including input 46 which transmits a signal indicating that the test pattern generation mode has been initiated.

AND gate input 44, which signifies a plurality of inputs of AND gate 48, is logically coupled to a plurality of inverted and non-inverted parallel outputs of shift register 60. When input 44 equals a certain state (i.e. test pattern) and the signal at input 46 is "true", the selecting signal at selecting input 47 of multiplexer 50 is "true", and a corresponding signal from circuit means 54 is passed through multiplexer 50 to serial input 42 of shift register 60. Circuit means 54 provides the non-inverted output of a stored test pattern signal in shift register 60 which is furthest away from serial input 42. During all other states of input 44 the selecting signal is "false", and the output of feedback network 56 is passed through multi-plexer 50 to serial input 42 of register 60. As a result of this switching between inputs of multiplexer 50, a test pattern signal sequence of $2^n$ unique patterns is applied to serial input 42 which causes shift register 60 to generate $2^n$ unique test patterns. This $2^n$ test pattern sequence could be used in exhaustive testing situations where all input states of a circuit should be addressed.

Figure 4:
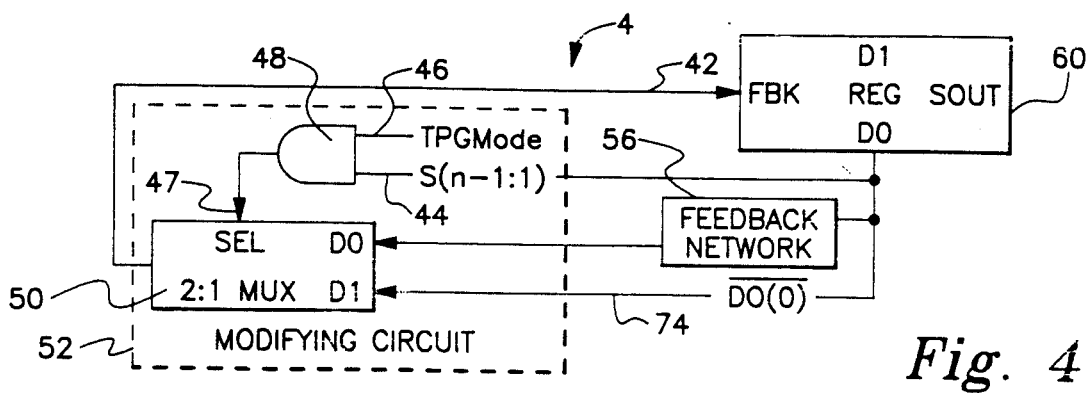
FIG. 4 is a drawing showing a general schematic diagram of an alternative embodiment of an exhaustive TPG which follows the concepts of the present invention.

FIG. 4 shows an alternative general schematic diagram of an exhaustive TPG 4 which follows the concepts of the present invention. The alternative schematic diagram differs from exhaustive TPG 2 in that circuit means 74 provides an inverted output of the bit which is furthest away from serial input 42. Depending upon the particular schematic diagram, the insertion of the $2^n$th test pattern in some test pattern generators may require an inverted or non-inverted output signal of a register bit (i.e. one "true"/"false" signal). Therefore, two possible general embodiments are shown in FIGS. 3 and 4 and labeled exhaustive TPG 2 and 4 respectively.

Specific embodiments of the present invention will vary according to the kind of shift register (i.e. inverting and non-inverting), the number of bits (i.e. odd or even) and the stuck-state (i.e. the test pattern normally missed when using an LFSR to generate a test pattern sequence). A shift register which is said to be inverting takes the inverted output of a bit and logically couples it to the following bit's input. In contrast, a shift register is said to be non-inverting when it takes the non-inverted output of a bit and logically couples it to the following bit's input.

Figure 5:
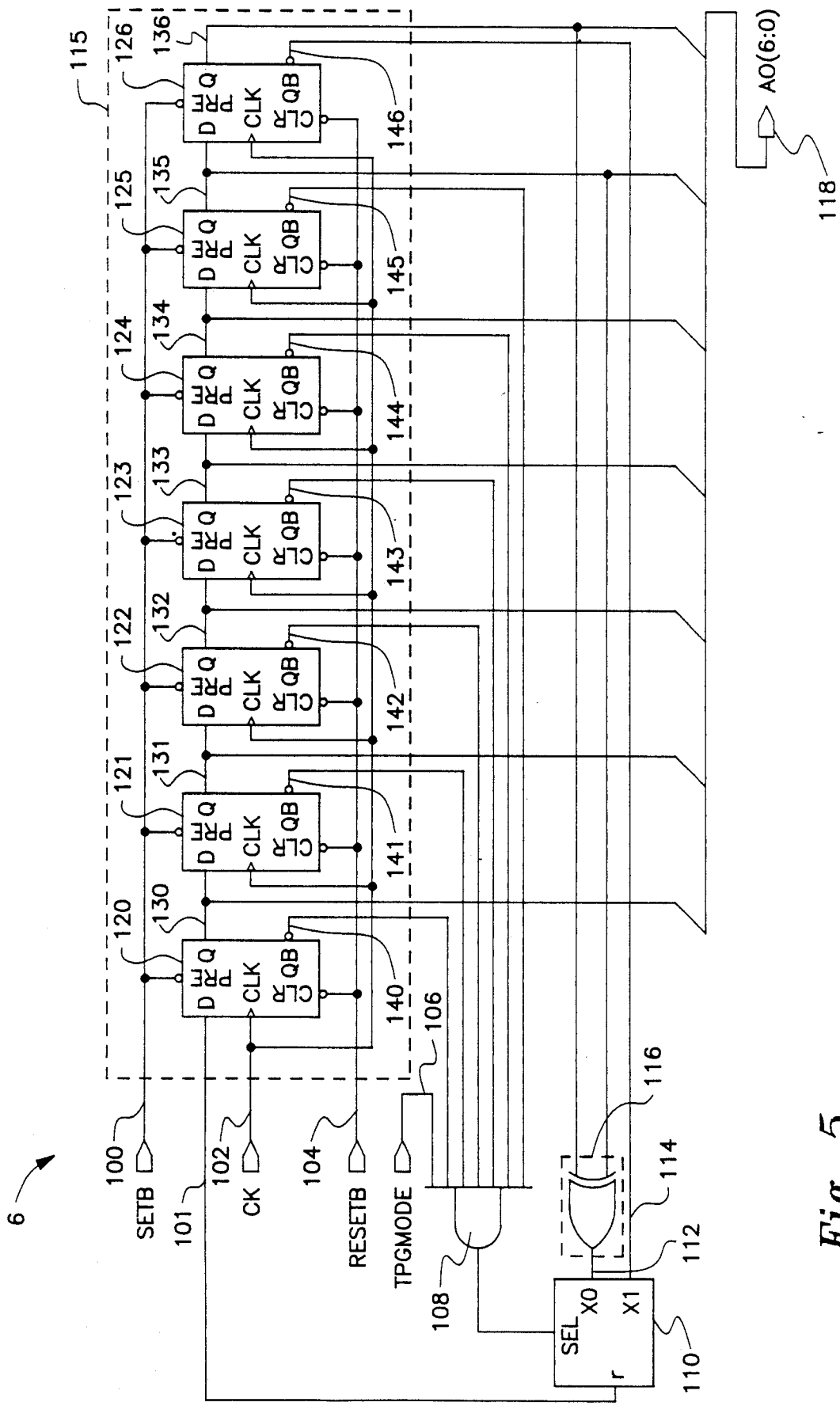
FIG. 5 is a diagram showing the preferred embodiment of an exhaustive TPG utilizing the concepts of the present invention.

FIG. 5 shows a preferred embodiment of an exhaustive TPG utilizing the concepts of the present invention. Exhaustive TPG 6 is a non-inverting, odd-bit TPG with a stuck-state of 0000000. Exhaustive TPG 6 comprises a non-inverting odd-bit shift register 115, feedback network 116 and a modifying circuit. Shift register 115 is comprised of seven flip-flops 120 through 126. Each flip-flop includes an input, an inverted output (i.e., elements 130 through 136) and a non-inverted inverted output (i.e. elements 140 through 146). Each flip-flop is logically coupled together from an output of a flip-flop to the input of the following flip-flop. An example of this is that the output of flip-flop 120 is logically coupled (e.g., electrically connected) to the input of flip-flop 121 so that a signal may pass between the two flip-flops. Such a logic coupling is generally referred to as serial coupling.

Each of the flip-flops include a PRE input. These inputs are logically coupled together to form an initialization signal input 100 for exhaustive TPG 6. Signal input 100 initializes each of the flip-flops to a "true" (e.g., binary one) state. Similarly, signal input 104 is logically coupled to each flip-flop CLR input so that the flip-flop can be initialized to a "false" (e.g., binary 0) state. These two initializing inputs are important in an exhaustive TPG. These inputs 100 and 104 enable an exhaustive TPG to be started with the same test pattern each time a test pattern sequence is started. It should be noted that it may be advantageous to start a test pattern sequence with a test pattern other than one comprising all "true" states or all "false" states. Each of the flip-flops also includes a CLK input logically coupled together to form signal input 102. Signal input 102 is usually logically coupled to a device external to exhaustive TPG 6 for sequencing the TPG through a plurality of test patterns.

Feedback network 116 provides at output 112 a signal which is the exclusive-or (XOR) function of flip-flop outputs 135 and 136. Feedback network 116 will provide up to $2^7-1$ different test pattern signals in a pseudo-random manner.

The modifying circuit shown comprises element 108 and a 2:1 multiplexer 110. Element 108 provides an output (selecting) signal to multiplexer 110. The selecting signal is generated from the logical AND of the inverted flip-flop outputs 140 through 145 and a TPG mode signal (via input 106) set to a "1" state, where the TPG mode signal set to a "1" state indicates that the exhaustive TPG is supposed to be generating test patterns. When set to "0" state, the TPG mode signal provided via input 106 allows the feedback network to be used for other purposes, such as signature analysis.

The output signal of element 108 is usually a "0" state; when that is the case, multiplexer 110 selects and passes the feedback network output signal from output 112 to input 101. When flip-flops 120 through 125 are set to a "0" state and flip-flop 126 is set to a "1" state, element 108 outputs a "1" state which configures multiplexer 110 to pass the signal at input 114 through multiplexer 110 to register input 101. Input 114 is logically coupled to register output 146, which provides a "0" state signal. Thus, a "0" state signal is input into flip-flop 120, and the previous states of flip-flops 120 through 125 are shifted into 121 through 126 respectively. The result is that the $2^7$th (stuck state) test pattern 0000000 is inserted into the test pattern sequence. Once this pattern is reached, element 108 provides an output signal set to "1", and multiplexer input 114 is selected and passed through to register input 101. Input 114, which is logically coupled to output 146, is a "1" state. Therefore, the next test pattern held in the flip-flops is 1000000. Thus, element 108 provides an AND function output signal of a "0" state, and exhaustive TPG 6 returns to selecting the feedback network signal from output 112 and thus passes that signal through multiplexer 110 to input 101.

Through this process, exhaustive TPG 6 will generate a test pattern sequence to output data bus 118 (which is logically coupled to flip-flop outputs 130 through 136) to provide a test pattern to an external device. The test pattern sequence generated will include $2^7$ different test patterns.

Figure 6:
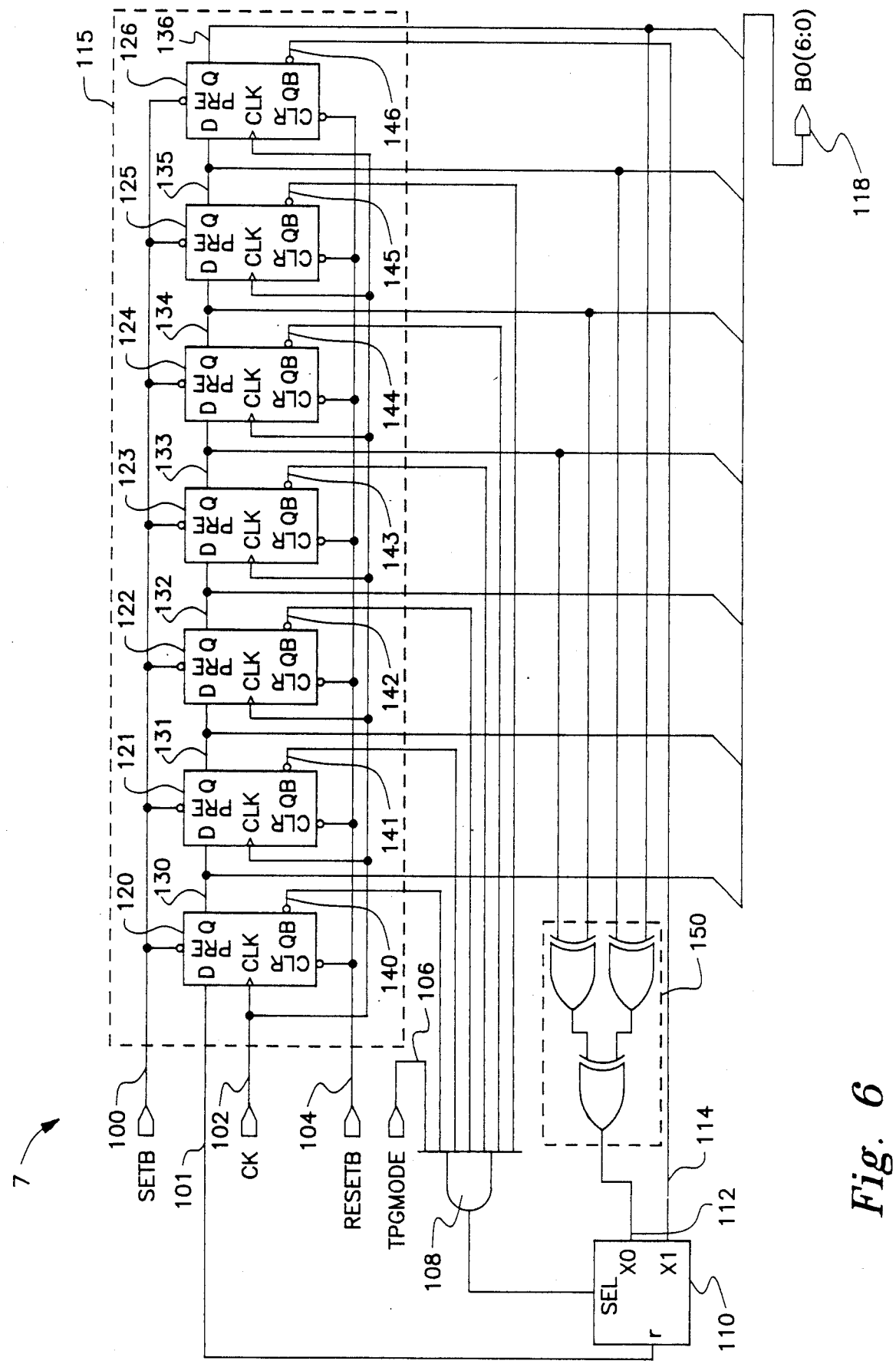
FIG. 6 is a diagram showing an alternative preferred embodiment of an exhaustive TPG.

Exhaustive TPG 7 shown in FIG. 6 is another preferred embodiment and is the same as exhaustive TPG 6 shown in FIG. 5 except for feedback network 150. Feedback network 150 provides an output signal at 112 which is the XOR function of flip-flop outputs 133 through 136. Feedback network 150 will provide a $2^7-1$ test pattern signal sequence different from feedback network 116. Consequently, test pattern signal sequence exhaustive TPG 7 will provide a sequence of $2^7$ different test patterns distinguishable from the sequence produced by exhaustive TPG 6.

Figure 7:
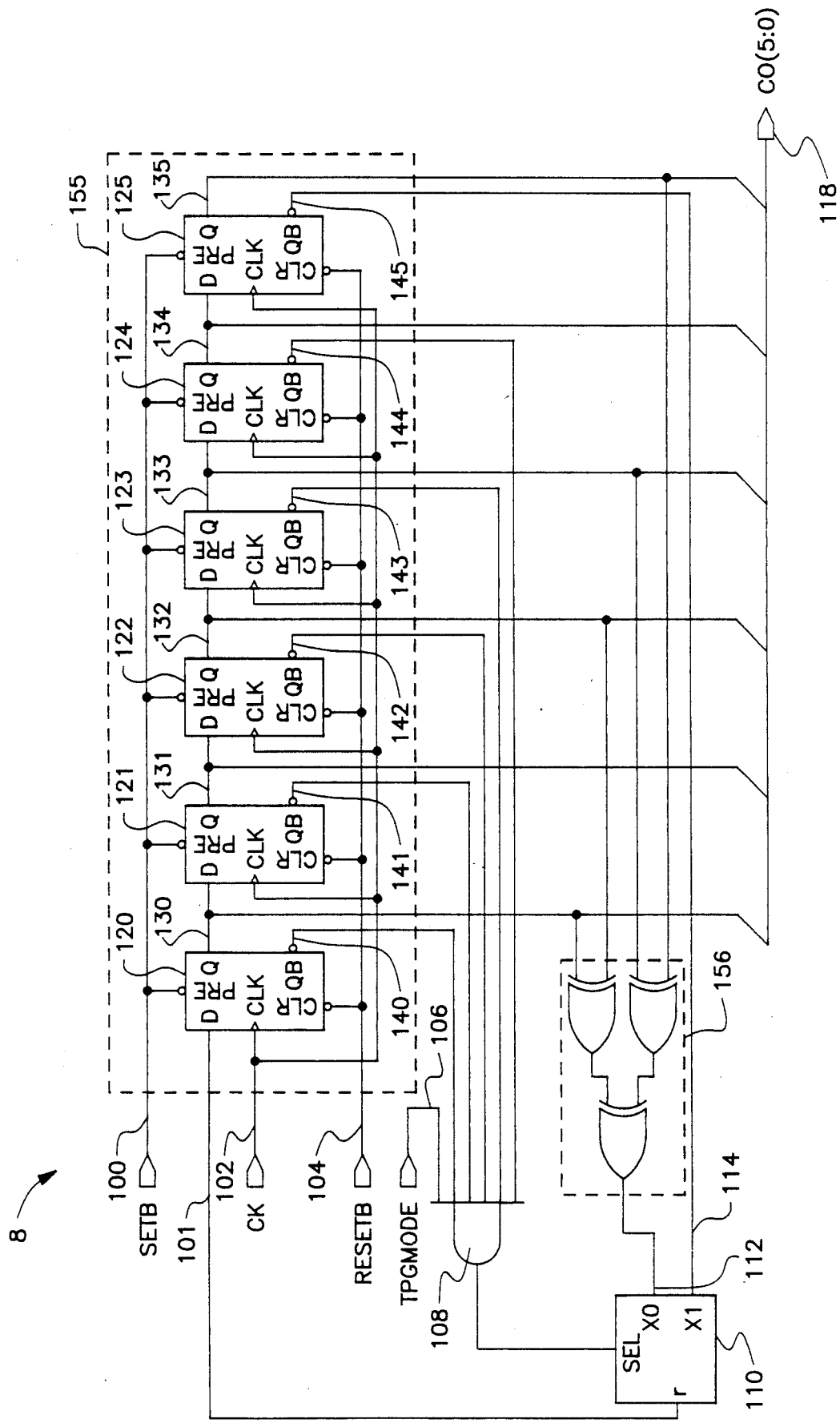
FIG. 7 is a diagram showing an alternative preferred embodiment of an exhaustive TPG.

FIG. 7 shows another preferred embodiment of an exhaustive TPG utilizing the concepts of the present invention. Exhaustive TPG 8 is a non-inverting, even-bit TPG with a stuck state of 000000. Exhaustive TPG 8 differs from exhaustive TPG 6 in that shift register 155 is even-bit and feedback network 156 is logically coupled differently to shift register 155. Shift register 155 contains six flip-flops and therefore is considered even-bit. As a result of their being only six flip-flops, one less output of the flip-flops is logically coupled to element 108. Output 135 is no longer needed for the correct selecting signal to be generated. Feedback network 156 provides an output signal at 112 which is the XOR function of flip-flop outputs 130, 132, 133, and 135. Feedback network 156 will provide a $2^6-1$ test pattern signal sequence. Consequently, exhaustive TPG 8 will provide a sequence of $2^6$ different test patterns.

Figure 8:
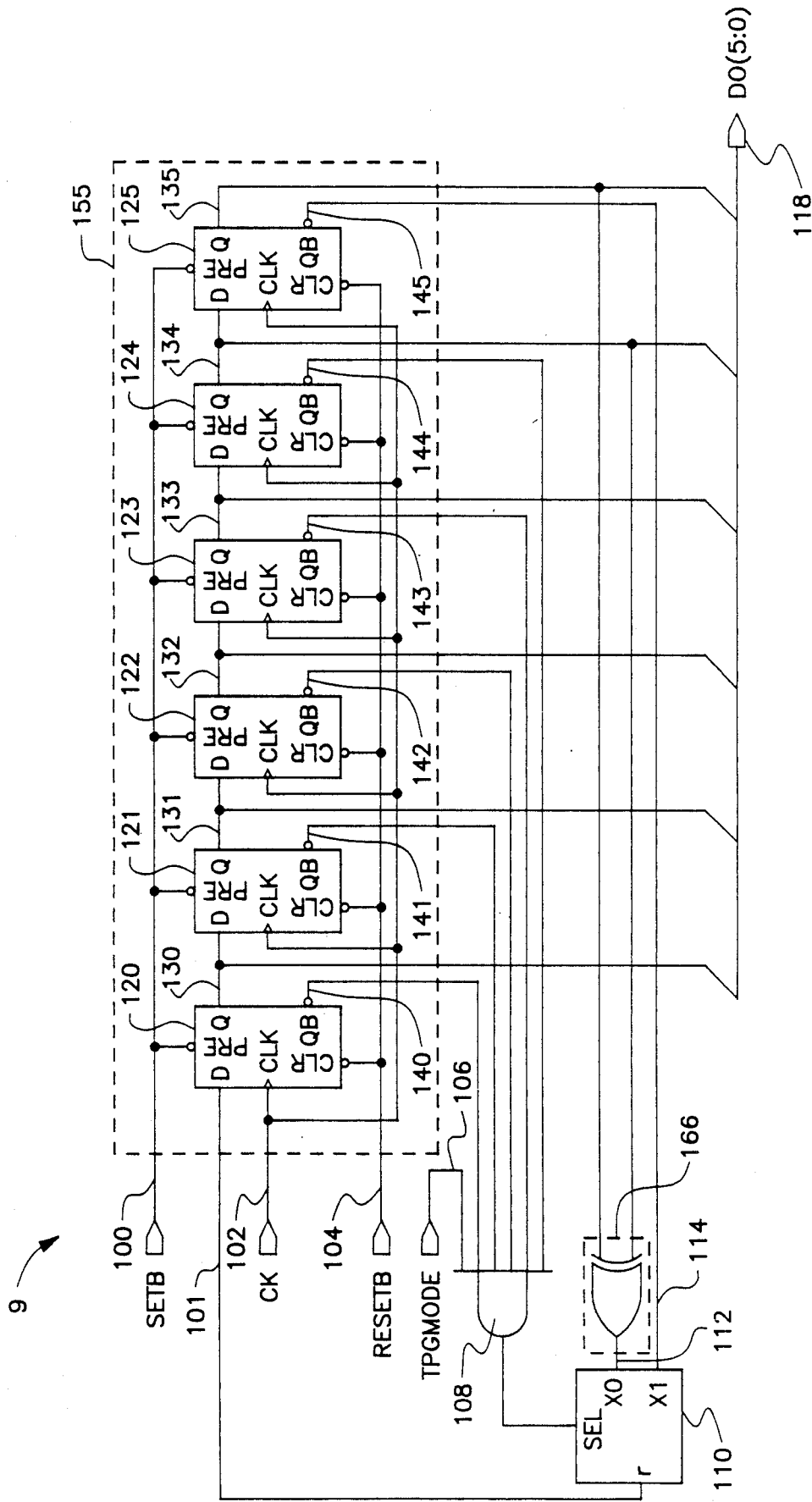
FIG. 8 is a diagram showing an alternative preferred embodiment of an exhaustive TPG.

FIG. 8 shows another preferred embodiment of an exhaustive TPG utilizing the concepts of the present invention. Exhaustive TPG 9 differs from exhaustive TPG 8 in that feedback network 166 is logically coupled differently to shift register 155 and provides a different output signal 112. Feedback network 166 provides an output signal at 112 which is the XOR function of flip-flop outputs 134 and 135. Feedback network 166 will provide a $2^6-1$ test pattern signal sequence different from feedback network 156. Consequently exhaustive TPG 9 will provide a sequence of $2^6$ different test patterns distinguishable from the sequence produced by exhaustive TPG 8.

Figure 9:
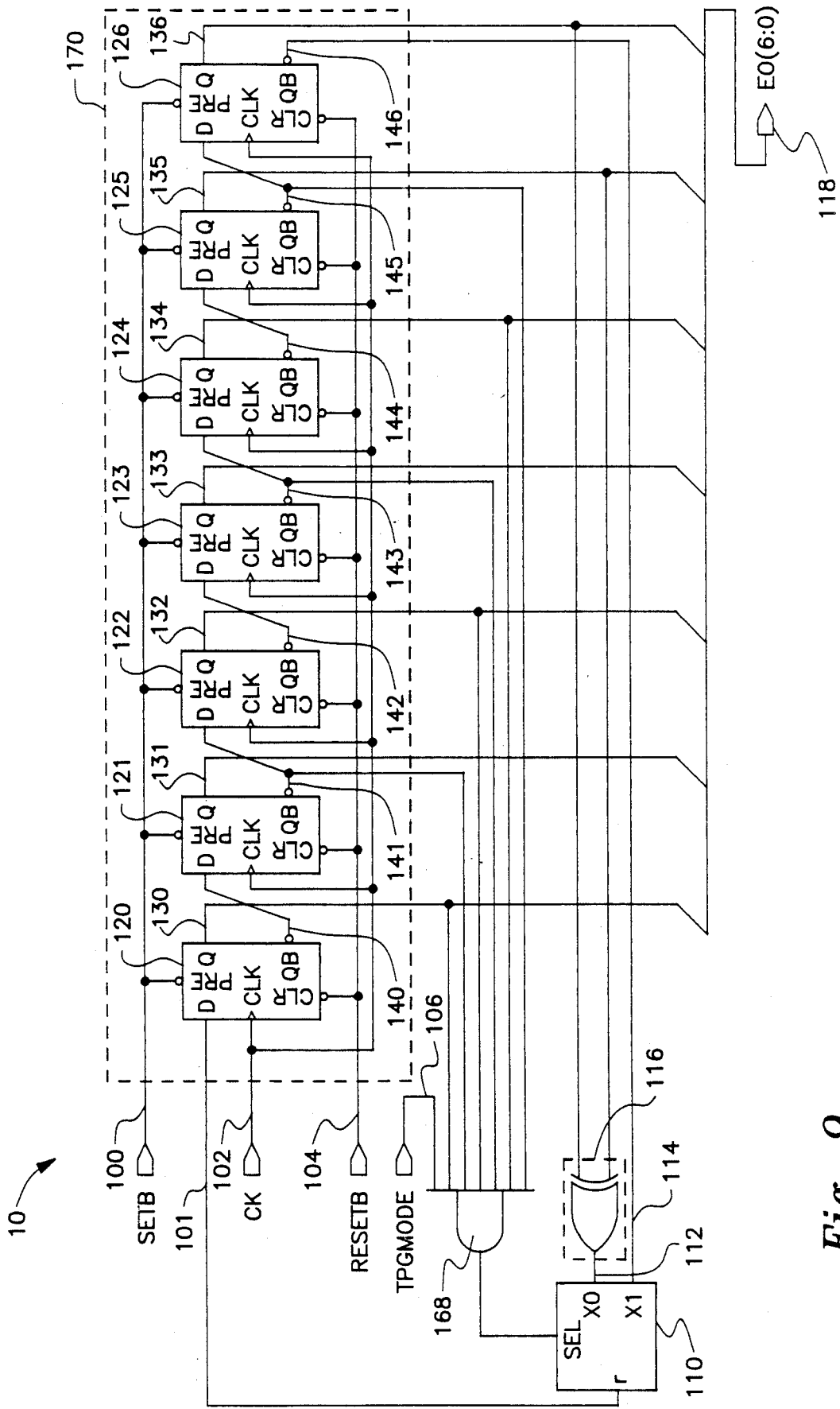
FIG. 9 is a diagram showing an alternative preferred embodiment of an exhaustive TPG.

FIG. 9 shows another preferred embodiment of an exhaustive TPG utilizing the concepts of the present invention. Exhaustive TPG 10 is an inverting, odd-bit TPG with a stuck state of 1010101. Exhaustive TPG 10 differs from exhaustive TPG 6 in that the shift register is inverting and element 168 is logically coupled differently to shift register 170 which causes a different stuck state. Shift register 170 is said to be inverting because the inverted output of a flip-flop is logically coupled to the input of the following flip-flop. An example of this is that the inverted output of flip-flop 120 is logically coupled to the input of flip-flop 121 so that a signal may pass between them.

Element 168 provides a selecting signal to multiplexer 110 which is generated from the logical AND of the TPG mode signal 106, the non-inverted flip-flop outputs 130, 132 and 134 as well as the inverted flip-flop outputs 141, 143 and 145. When the non-inverted outputs of flip-flops 120 through 126 reach the test pattern 1010100, element 168 sends a selecting signal to multiplexer 110, which selects input 114. The result is that the $2^7$th (stuck state) test pattern 1010101 is inserted into the test pattern sequence. Once this pattern is reached, element 108 continues to provide an enabling signal to multiplexer 110 which selects input 114 so that test pattern 0101010 is generated. This new pattern causes the selecting signal of element 108 to select the feedback network output signal at 112. As a result, exhaustive TPG 10 inserts the $2^7$th test pattern into the $2^7-1$ test pattern sequence. Consequently, exhaustive TPG 10 will provide a sequence of $2^7$ different test patterns.

Figure 10:
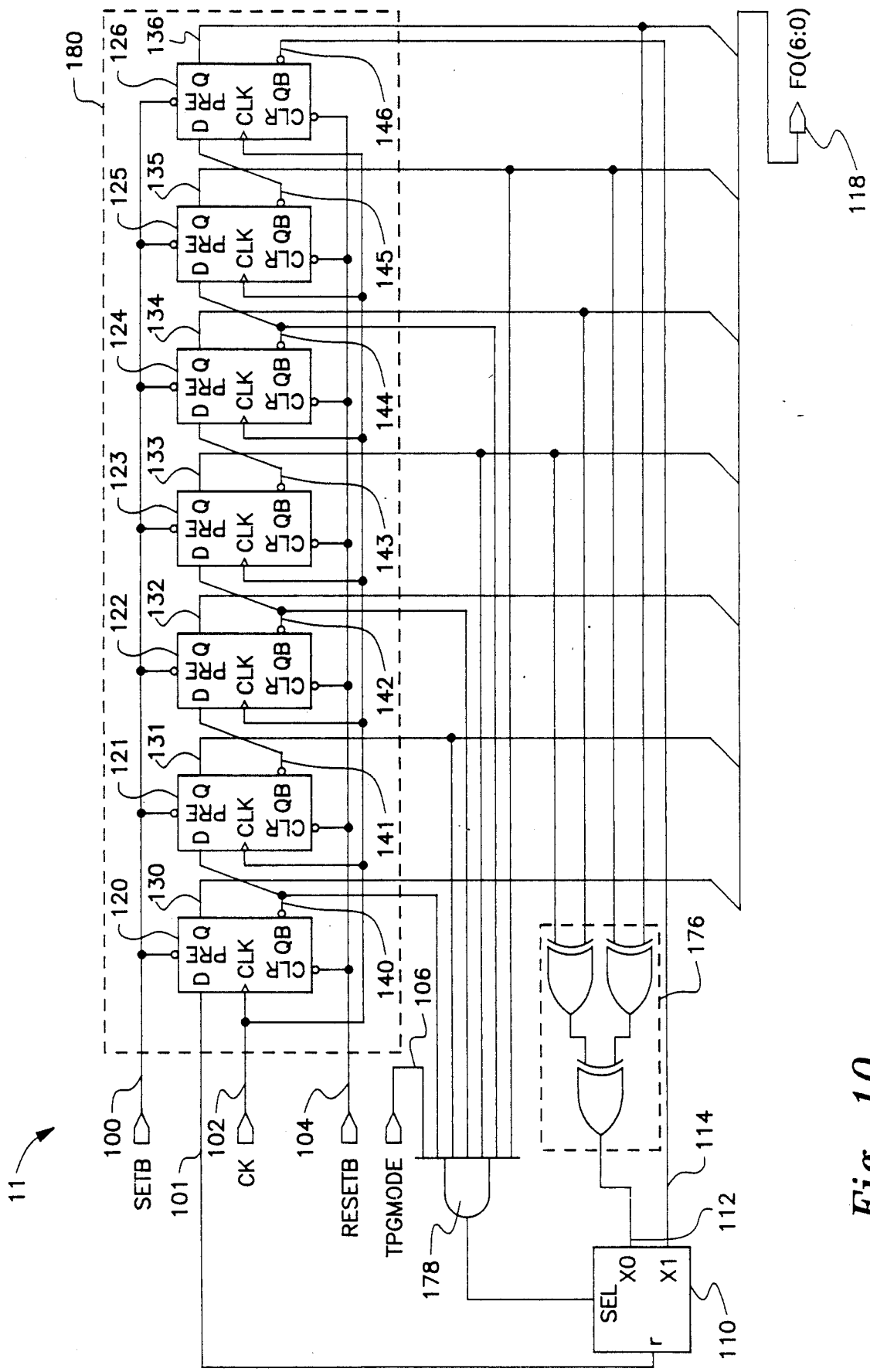
FIG. 10 is a diagram showing an alternative preferred embodiment of an exhaustive TPG.

FIG. 10 shows another preferred embodiment of an exhaustive TPG utilizing the concepts of the present invention. Exhaustive TPG 11 is an inverting, odd-bit TPG with a stuck state of 0101010. Exhaustive TPG 11 differs from exhaustive TPG 10 in that element 178 and feedback network 176 are logically coupled differently to shift register 180. Element 178 provides a selecting signal to multiplexer 110 generated from the logical AND of TPG mode signal 106, the non-inverted flip-flop outputs 131, 133, and 135 as well as the inverted flip-flop outputs 140, 142, and 144.

When the non-inverted outputs of flip-flops 120 through 126 reach the test pattern 0101011, element 178 sends a selecting signal to multiplexer 110 which selects input 114. The result is that the $2^7$th (stuck state) test pattern 0101010 is inserted into the test pattern sequence. Once this pattern is reached, element 178 continues to provide a selecting signal to multiplexer 110 which selects input 114 so that test pattern 1010101 is generated. This new pattern causes the selecting signal of element 178 to select the feedback network output signal at 112. Feedback network 176 provides an output signal at 112 which is the XOR function of flip-flop outputs 133 through 136. Feedback network 176 will provide a $2^7-1$ test pattern sequence different from feedback network 116. As a result exhaustive TPG 11 inserts the $2^7$th test pattern into the $2^7-1$ test pattern sequence. Consequently, exhaustive TPG 11 will provide a sequence of $2^7$ different test patterns.

Figure 11:
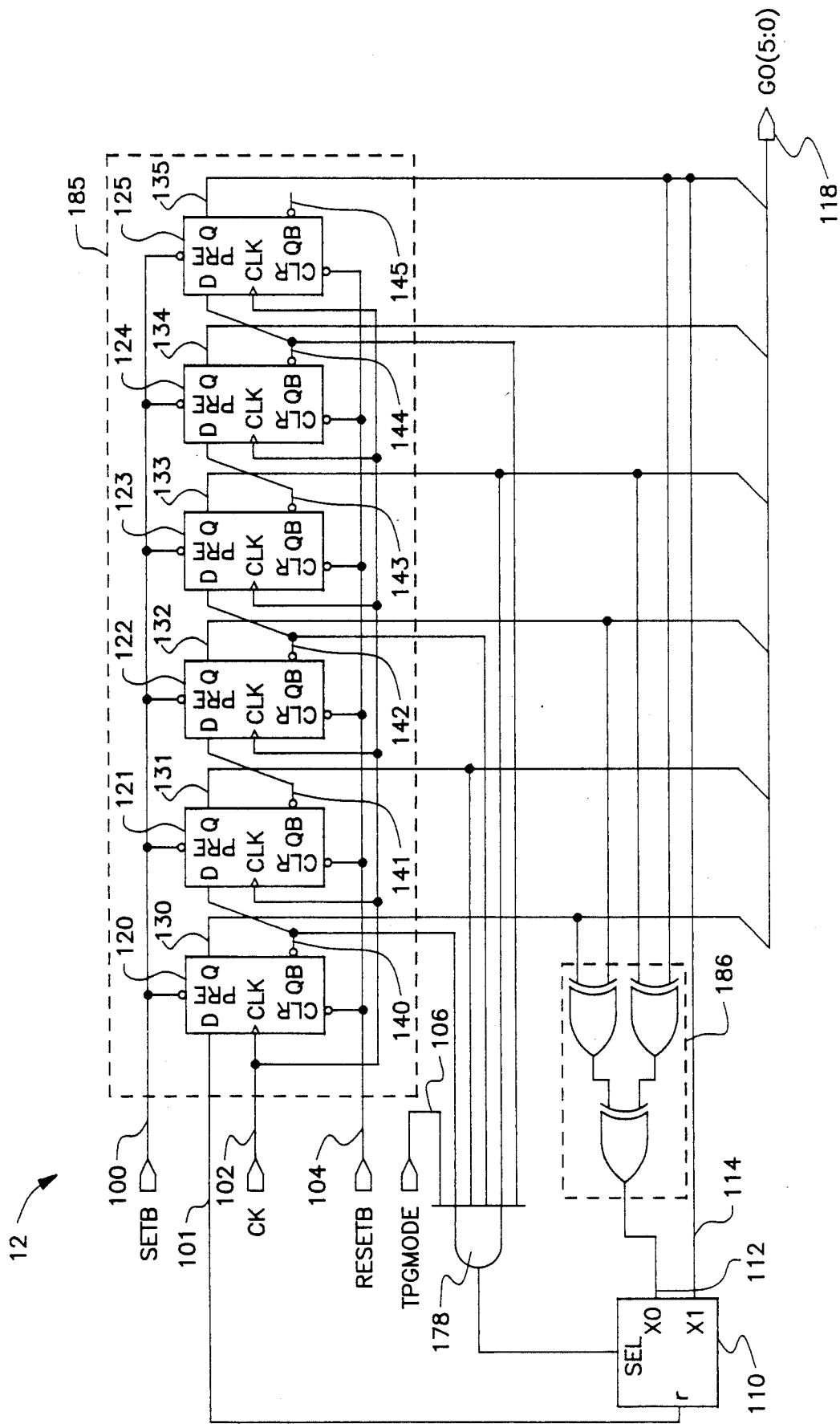
FIG. 11 is a diagram showing an alternative preferred embodiment of an exhaustive TPG.

FIG. 11 shows another preferred embodiment of an exhaustive TPG utilizing the concepts of the present invention. Exhaustive TPG 12 is an inverting, even-bit TPG with a stuck state of 010101. Exhaustive TPG 12 differs from exhaustive TPG 11 in that shift register 185 is even-bit, feedback network 186 is logically coupled differently to shift register 185 and signal 114 is logically coupled differently to shift register 185. Shift register 185 contains six flip-flops and therefore is considered even-bit. As a result of having only six flip-flops one less output is logically coupled to element 178. Output 135 is no longer needed for the correct selecting signal to be generated. Feedback network 186 provides an output signal 112, which is the XOR function of flip-flop outputs 130, 132, 133, and 135. Feedback network 186 will provide a $2^6-1$ test pattern signal sequence. Consequently, exhaustive TPG 12 will provide a sequence of $2^6$ different test patterns.

Figure 12:
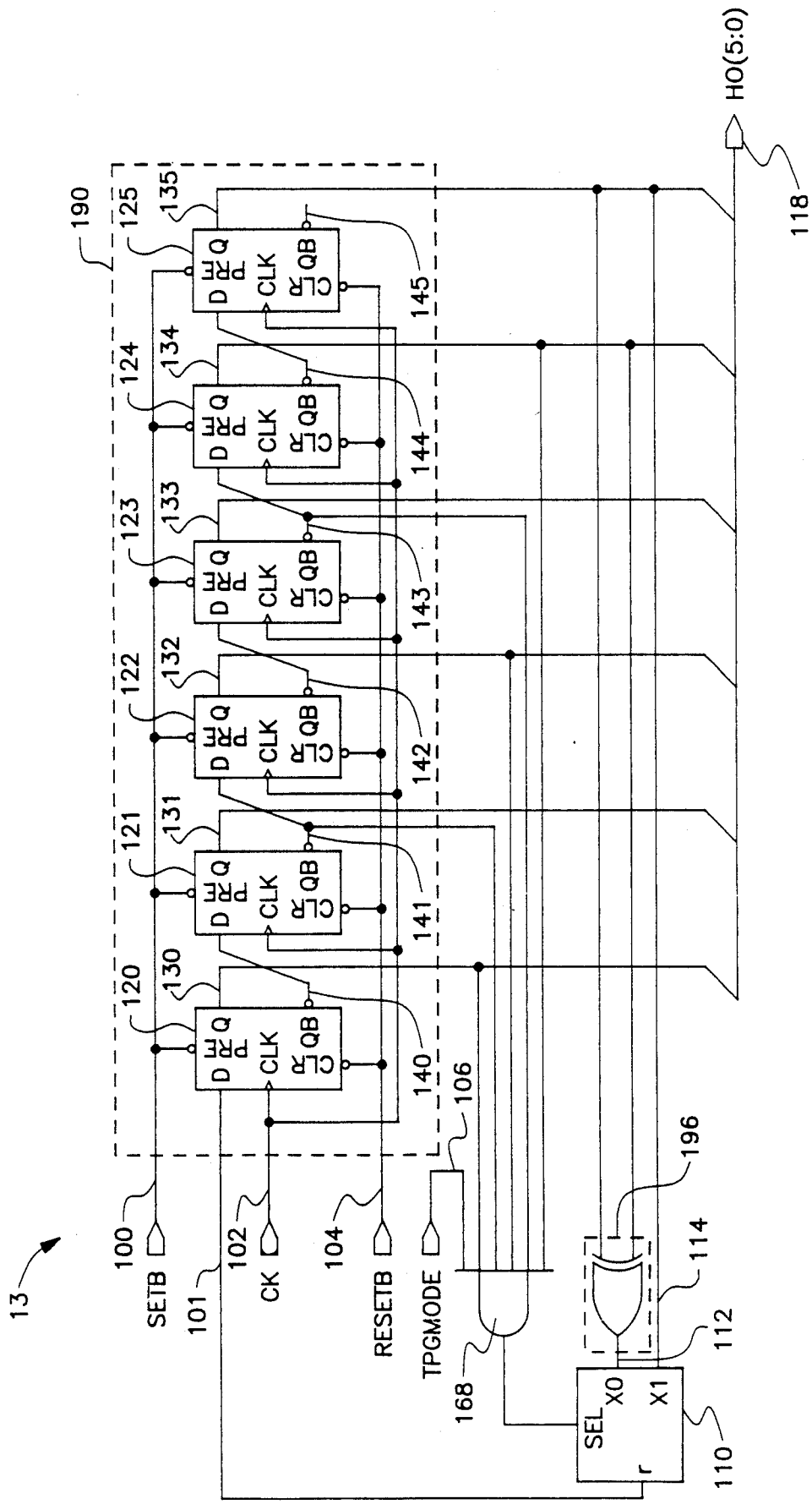
FIG. 12 is a diagram showing an alternative preferred embodiment of an exhaustive TPG.

FIG. 12 shows another preferred embodiment of an exhaustive TPG utilizing the concepts of the present invention. Exhaustive TPG 13 is an inverting, even-bit TPG with a stuck state of 101010. Exhaustive TPG 13 differs from exhaustive TPG 10 in that shift register 190 is even-bit, feedback network 196 is logically coupled differently to shift register 190 and signal 114 is logically coupled differently to shift register 190. Shift register 190 contains six flip-flops and therefore is considered even-bit. As a result of only having six flip-flops, one less output is logically coupled to element 168.

Output 135 is no longer needed for the correct selecting signal to be generated. Feedback network 196 provides an output signal at 112 which is the XOR function of flip-flop outputs 134 and 135. Feedback network 196 will provide a $2^6-1$ test pattern signal sequence. Consequently, exhaustive TPG 13 will provide a sequence of $2^6$ different test patterns.

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed.

What is claimed is:

1. An exhaustive test pattern generator for generating $2^n$ test patterns, comprising:
   (a) feedback shift register means comprising a feedback network logically coupled to only a single input of a shift register for generating a sequence of $2^n-1$ test patterns;
   (b) means external to the feedback shift register means for generating a $2^n$th test pattern and for inserting the $2^n$th test pattern into the sequence of $2^n-1$ test patterns; and
   (c) output means for providing the sequence of $2^n$ test patterns.

2. The test pattern generator of claim 1 wherein the feedback shift register means comprises means for generating a test pattern sequence which is pseudo-random in nature.

3. The test pattern generator of claim 1 wherein the feedback shift register means comprises initializing means for setting the initial test pattern of the sequence generated by the feedback shift register means.

4. The test pattern generator of claim 1 wherein the combination of the feedback network and shift register operate as a linear feedback shift register.

5. The test pattern generator of claim 1 wherein the means external to the feedback shift register means logically comprises a multiplexer and additional combinational logic.

6. The test pattern generator of claim 1 wherein the feedback shift register means comprises a series of bistable multivibrators logically serially connected together to form a shift register.

7. The test pattern generator of claim 6 wherein the means external to the feedback shift register means logically comprises a multiplexer and additional combinational logic.

8. The test pattern generator of claim 7 wherein the additional combinational logic comprises means for providing to the multiplexer a selecting signal comprised of a logical AND of a plurality of outputs of the bi-stable multivibrators 9. The test pattern generator of claim 7 wherein the additional combinational logic comprises means for logically coupling the output of the last bi-stable multivibrator of the feedback shift register means to an input of the multiplexer.

10. The test pattern generator of claim 7 wherein the additional combinational logic comprises means for logically coupling the inverted output of the last bi-stable multivibrator of the feedback shift register means to an input of the multiplexer.

11. A test pattern generator for generating $2^n$ test patterns, comprising:

(a) shift register means for storing a series of test pattern signals as a test pattern;
   (b) feedback network means logically coupled to an output of the shift register means for generating a sequence of $2^n-1$ test pattern signals;
   (c) circuit means logically coupled to an output of the shift register means for generating a $2^n$th test pattern signal;
   (d) switching means logically coupled to the shift register means, the feedback network means and the circuit means for inserting the $2^n$th test pattern signal into the sequence of test pattern signals generated by the feedback network means and for serially providing the sequence of $2^n$ test pattern signals to only a single input of the shift register means; and
   (e) output means for providing the sequence of $2^n$ test patterns.

12. The test pattern generator of claim 11 wherein the sequence of $2^n$ test pattern signals serially provided to only a single input of the shift register means is pseudo-random in nature.

13. The test pattern generator of claim 11 wherein the shift register means comprises initializing means for setting the initial test pattern of the sequence stored by the shift register means.

14. The test pattern generator of claim 11 wherein the combination of the shift register means and the feedback network means operate as a linear feedback shift register.

15. The test pattern generator of claim 11 wherein the shift register means comprises a series of bi-stable multivibrators logically serially connected together to form a shift register.

16. The test pattern generator of claim 15 wherein the circuit means comprises the non-inverted output of the last bi-stable multivibrator of the shift register means logically coupled to an input of the switching means.

17. The test pattern generator of claim 15 wherein the circuit means comprises the inverted output of the last bi-stable multi-vibrator of the shift register means logically coupled to an input of the switching means.

18. The test pattern generator of claim 15 wherein the switching means logically comprises a multiplexer and means for providing to the multiplexer a selecting signal comprising the logical AND of a plurality of outputs of the bi-stable multi-vibrators.

19. The test pattern generator of claim 18 wherein the plurality of outputs of the bi-stable multi-vibrators comprise non-inverted outputs of the bi-stable multi-vibrators.

20. The test pattern generator of claim 18 wherein the plurality of outputs of the bi-stable multi-vibrators comprise inverted outputs of the bi-stable multi-vibrators.

21. The test pattern generator of claim 18 wherein the plurality of outputs of the bi-stable multi-vibrators comprise non-inverted and inverted outputs of the bi-stable multi-vibrators.

22. The test pattern generator of claim 11 wherein:
   (a) the feedback network means logically couples exclusively to outputs of the shift register means;
   (b) the circuit means logically couples exclusively to outputs of the shift register means; and
   (c) the switching means provides the test pattern signals exclusively to a most significant input of the shift register means.

23. A method for generating $2^n$ test patterns for use in exhaustive testing, comprising the steps of:

(a) checking a selecting signal for a "true" or a "false" signal;
(b) if the selecting signal is "true", generating with a feedback shift register device comprising a feedback network logically coupled to only a single input of a shift register one of $2^n-1$ possible test patterns;
(c) if the selecting signal is "false", generating with means external to the feedback shift register device a $2^n$th test pattern not included in the $2^n-1$ possible test patterns generated by the feedback shift register device;
(d) outputting the test pattern to an external element;
(e) feeding back the outputted test pattern through the feedback network; and
(f) repeating steps (a) through (e) to generate an exhaustive test sequence of $2^n$ unique test patterns.

24. The method of claim 23 wherein "true" is equivalent to a binary "1" state and "false" is equivalent to a binary "0" state.

25. The method of claim 23 wherein "true" is equivalent to a binary "0" state and "false" is equivalent to a binary "1" state.

26. A test pattern generator for generating $2^n$ test patterns, comprising:
(a) shift register means comprising a plurality of bistable multi-vibrators logically coupled in series from an output signal of a first bi-stable multi-vibrator to an input signal of a second bi-stable multi-vibrator for storing a series of test pattern signals as one of $2^n$ test patterns, the plurality of bi-stable multi-vibrators including initializing means for setting the initial test pattern signals stored by the bi-stable multi-vibrators so that the shift register means can be set to a predetermined test pattern at the beginning of test pattern generation;
(b) feedback means comprising combinational logic logically coupled to a plurality of output signals form the bistable multi-vibrators for generating an XOR function of the output signals and for providing to an output the generated function as one of a sequence of $2^n-1$ test pattern signals so that a sequence of $2^n-1$ unique test pattern signals is generated;
(c) circuit means logically coupled to one of the output signals of one of the bi-stable multi-vibrators in the shift register means for providing to an output the $2^n$th test pattern signal;
(d) switching means for inserting the $2^n$th test pattern signal provided by the output of the circuit means into the sequence of signals generated by the output of the feedback means so that a sequence of $2^n$ test patterns is generated and for serially providing the sequence of $2^n$ test pattern signals to only a single input of the shift register means; and
(e) output means logically coupled to at least one of the bi-stable multi-vibrator outputs for providing the sequence of $2^n$ test patterns.

27. A test pattern generator of claim 26 wherein the switching means comprises:
(a) circuit element means for providing to an output a logical AND function of a plurality of flip-flop outputs; and
(b) a multiplexer comprising:
(i) an input logically coupled to the output of the feedback means;
(ii) an input logically coupled to the output of the circuit means;
(iii) an output logically coupled to only a single input of one of the bi-stable multi-vibrators in the register means; and
(iv) a selecting input logically coupled to the output of the circuit element means for selecting one of the multiplexer inputs as the multiplexer output.

* * * * *